(12) United States Patent
Betsuyaku et al.

(10) Patent No.: US 12,735,807 B2
(45) Date of Patent: Sep. 15, 2026

(54) SILICON CARBIDE SINGLE CRYSTAL INGOT

(71) Applicants: CENTRAL RESEARCH INSTITUTE OF ELECTRIC POWER INDUSTRY, Tokyo (JP); MIRISE Technologies Corporation, Nisshin (JP); DENSO CORPORATION, Kariya (JP); TOYOTA JIDOSHA KABUSHIKI KAISHA, Toyota (JP)

(72) Inventors: Kiyoshi Betsuyaku, Tokyo (JP); Norihiro Hoshino, Tokyo (JP); Isaho Kamata, Tokyo (JP); Hidekazu Tsuchida, Tokyo (JP); Akiyoshi Horiai, Nisshin (JP); Takeshi Okamoto, Nisshin (JP)

(73) Assignees: CENTRAL RESEARCH INSTITUTE OF ELECTRIC POWER INDUSTRY, Tokyo (JP); MIRISE Technologies Corporation, Nisshin (JP); DENSO CORPORATION, Kariya-city (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 132 days.

(21) Appl. No.: 18/478,203

(22) Filed: Sep. 29, 2023

(65) Prior Publication Data

US 2024/0110309 A1 Apr. 4, 2024

(30) Foreign Application Priority Data

Oct. 3, 2022 (JP) ................................ 2022-159842

(51) Int. Cl.
*C30B 25/20* (2006.01)
*C30B 29/06* (2006.01)

(52) U.S. Cl.
CPC .............. *C30B 25/20* (2013.01); *C30B 29/06* (2013.01)

(58) Field of Classification Search
CPC ..... B32B 15/043; C30B 25/20; C30B 25/205; C30B 29/06
See application file for complete search history.

(56) References Cited

U.S. PATENT DOCUMENTS

2012/0294790 A1* 11/2012 Sasaki .................. C30B 23/025 428/137
2019/0333998 A1 10/2019 Masumoto et al.
2022/0112623 A1 4/2022 Hoshino et al.

FOREIGN PATENT DOCUMENTS

JP 2012-240892 A 12/2012
JP 2013107788 A * 6/2013

OTHER PUBLICATIONS

English translation of JP 2013-107788A obtained form EPO espacenet Nov. 12, 2025. (Year: 2025).*

(Continued)

*Primary Examiner* — Adam Krupicka
(74) *Attorney, Agent, or Firm* — Posz Law Group, PLC

(57) ABSTRACT

Provided are a method for manufacturing a silicon carbide single crystal, and a silicon carbide single crystal ingot which ensure a high crystal growth rate and increase the ratio of conversion from basal plane dislocations to threading edge dislocations. The method prepares a seed substrate composed of silicon carbide having an off-angle in a [1-100] direction with respect to a {0001} plane; and grows a silicon carbide single crystal layer on the seed substrate by an HTCVD method, thereby converting basal plane dislocations contained in the seed substrate to threading edge dislocations during crystal growth.

1 Claim, 6 Drawing Sheets

(56) References Cited

OTHER PUBLICATIONS

Office Action issued on Jan. 28, 2026 in corresponding Japanese patent application No. 2022-159842 (and English machine translation).

Norihiro Hoshino et al., "Reduction in dislocation densitites in 4H-SiC bulk crystal grown at high growth rate by high-temperature gas-source method", Applied Physics Express, vol. 13, 095502, Aug. 19, 2020, pp. 1-5, DOI: 10.35848/1882-0786/abace0.

Yuichiro Tokuda et al., "Demonstration of High-Speed Growth of phi 4 inch Thick 4H-SiC Single Crystals by High Temperature Chemical Vapor Deposition (HTCVD) Method", Proceedings of the 66th Annual Meetinh of the Society of Applied Physics, Feb. 25, 2019 (and English machine translation).

Office Action issued on Jun. 24, 2026 in corresponding Japanese patent application No. 2022-159842 (and English machine translation).

* cited by examiner

1
TED
3
2
BPD-1
A-A
BPD-3
(11$\bar{2}$0)

PRIOR ART

PRIOR ART

SILICON CARBIDE SINGLE CRYSTAL INGOT

The entire disclosure of Japanese Patent Application No. 2022-159842 filed on Oct. 3, 2022 is expressly incorporated by reference herein.

TECHNICAL FIELD

This invention relates to a method for manufacturing a silicon carbide single crystal, and a silicon carbide single crystal ingot.

BACKGROUND ART

Silicon carbide (may hereinafter be referred to as SiC) is a semiconductor exhibiting excellent physical property values—a bandgap about 3 times as wide as, a saturation drift velocity about 2 times as high as, and a dielectric breakdown field strength about 10 times as high as, those of Si—and having a great thermal conductivity. Thus, it is expected as a material which realizes a next generation high voltage, low loss semiconductor device delivering performance markedly surpassing the performance of the Si single crystal semiconductor currently in use.

As a method for manufacturing an ingot composed of an SiC single crystal, a sublimation method or high temperature chemical vapor deposition (hereinafter called HTCVD or an HTCVD method) is known. A method for manufacturing a conventional ingot will be described using FIGS. 5 to 7. FIG. 5 is a plan view of the crystal surface of an SiC ingot 1 having an SiC single crystal layer 3 grown on a seed substrate 2 (see FIG. 6). FIG. 6 is a sectional view taken on line E-E of FIG. 5, and FIG. 7 is a sectional view taken on line F-F of FIG. 5. The section on line E-E and the section on line F-F are both sections of a (1-100) plane. In FIGS. 5 to 7, some of basal plane dislocations (may be referred to as BPDs), which do not appear in the surface or section, are indicated in broken lines.

Generally, with the HTCVD method, the seed substrate 2 provided with an off-angle in a [11-20] direction is used, and the SiC single crystal layer 3 is step-flow grown on the seed substrate 2 in the [11-20] direction. The seed substrate 2 contains BPDs whose Burgers vectors are ±[11-20], ±[−2110], and ±[1-210].

A dislocation line can head in any direction. In order that BPD is converted to threading edge dislocation (may be referred to as TED), however, the BPD needs to cross-slip between the basal plane and the prismatic plane. Thus, it needs to be converted to a pure screw dislocation parallel to or antiparallel to the Burgers vector. For this purpose, in FIG. 5, BPDs which are pure screw dislocations having dislocation lines heading in the [11-20], [−2110], and [1-210] directions are shown for the sake of simplicity. BPD-4 and BPD-5 are illustrated as BPDs having dislocation lines in the [11-20] direction. BPD-6 is illustrated as BPD having a dislocation line in the [−2110] direction. BPD-7 is illustrated as BPD having a dislocation line in the [1-210] direction.

BPD-4, one of such BPDs, advances to the SiC single crystal layer 3 with the growth of the SiC single crystal layer 3, and is converted to TED within the range of the thickness of the SiC single crystal layer 3 measuring 1 mm, as shown in FIGS. 5 and 6. On the other hand, BPD-5, one of the BPDs contained in the seed substrate 2, advances unchanged into the SiC single crystal layer 3, as shown in FIGS. 5 and 7. If the direction of the off-angle and the direction of the dislocation line are parallel (both, [11-20]) as seen above, BPD of the seed substrate 2 advances, as such, to the SiC single crystal layer 3. With the HTCVD method, if the seed substrate 2 having the off-angle provided in the [11-20] direction is used, a high proportion of the BPDs advance unchanged without being converted to TEDs. That is, the ratio of conversion from BPDs to TEDs is low. BPD-6 and BPD-7, the directions of whose dislocation lines are non-parallel to the direction of the step-flow, are both converted to TEDs as the SiC single crystal layer 3 grows.

Patent Document 1 describes the formation of a silicon carbide single crystal layer using a seed substrate provided with an off-angle in the [11-20] or [1-100] direction. However, this method is a sublimation method involving a slow growth rate. Nor does Patent Document 1 suggest the differences between the provision of the off-angle in the [11-20] direction and the provision of the off-angle in the [1-100] direction.

PRIOR ART LITERATURES

Patent Documents

Patent Document 1: JP-A-2012-240892

SUMMARY OF INVENTION

Problems to be Solved by the Invention

The present invention has been accomplished in the light of the above-described circumstances. It is an object of this invention to provide a method for manufacturing a silicon carbide single crystal which ensures a high crystal growth rate and increases the ratio of conversion from basal plane dislocations to threading edge dislocations; and to provide a silicon carbide single crystal ingot bringing such advantages.

Means for Solving the Problems

A first aspect of the present invention for attaining the above object is a method for manufacturing a silicon carbide single crystal, comprising preparing a seed substrate composed of silicon carbide having an off-angle in a [1-100] direction with respect to a {0001} plane, and growing a silicon carbide single crystal layer on the seed substrate by an HTCVD method, thereby converting basal plane dislocations contained in the seed substrate to threading edge dislocations.

According to the first aspect, there can be manufactured a silicon carbide single crystal whose crystal growth rate is heightened and in which the ratio of conversion from basal plane dislocations to threading edge dislocations is increased. Moreover, a silicon carbide single crystal reduced in step bunching can be manufactured.

A second aspect of the present invention is the method for manufacturing a silicon carbide single crystal according to the first aspect, wherein with the HTCVD method, a growth temperature is 2,450° C. or higher, and an average growth rate during a period until the silicon carbide single crystal layer grows to a thickness of 1 mm is 1 mm/h or more.

According to the second aspect, a silicon carbide single crystal, whose crystal growth rate is heightened and in which the ratio of conversion from basal plane dislocations to threading edge dislocations is increased, can be manufactured more reliably.

A third aspect of the present invention is a silicon carbide single crystal ingot having a silicon carbide single crystal layer formed on a seed substrate, wherein the seed substrate is composed of silicon carbide having an off-angle in a [1-100] direction with respect to a {0001} plane, and the ratio of conversion from basal plane dislocations to threading edge dislocations in the silicon carbide single crystal layer is 80% or more within a range of the thickness of the silicon carbide single crystal layer from a boundary with the seed substrate.

According to the third aspect, in a silicon carbide single crystal layer for use as a wafer, basal plane dislocations are reduced. Thus, a silicon carbide single crystal ingot which can provide a wafer suitable for the manufacture of a semiconductor device is obtained. Furthermore, a silicon carbide single crystal ingot reduced in step bunching is obtained.

Effects of the Invention

According to the present invention, there are provided a method for manufacturing a silicon carbide single crystal, and a silicon carbide single crystal ingot, which are heightened in the crystal growth rate and increased in the ratio of conversion from basal plane dislocations to threading edge dislocations.

MODE FOR CARRYING OUT INVENTION

Herein, an individual plane orientation is represented by (hkil), while a generic plane orientation including (hkil) and a plane orientation equivalent crystallogeometrically thereto is represented by {hkil}. Moreover, an individual direction is represented by [hkil]. In connection with a negative index, it is general crystallogeometrically to represent it by attaching "-" (bar) over a numeral denoting the index. Herein, however, the negative index is represented by attaching a negative sign (−) before a numeral denoting the index.

Figure 1:
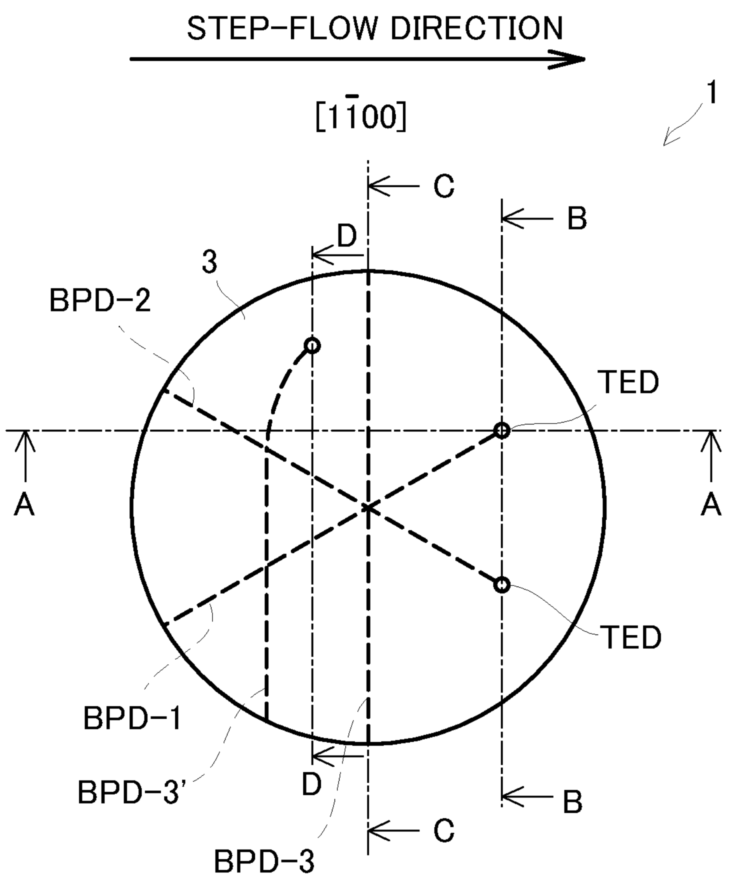
FIG. 1 is a plan view of a silicon carbide single crystal ingot according to an embodiment of the present invention.
Figures 2A, 2B:
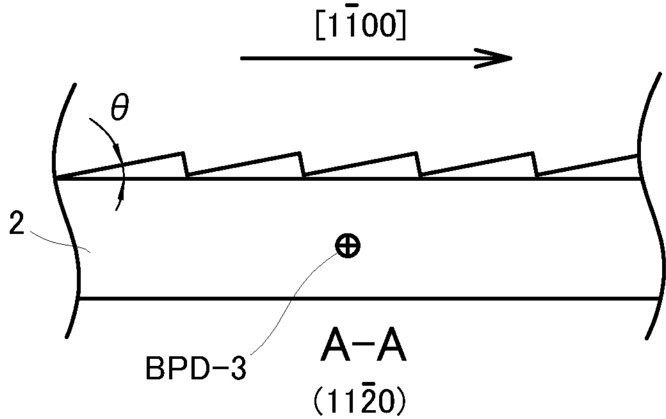
FIGS. 2A and 2B are sectional views taken on line A-A of FIG. 1.
Figure 3:
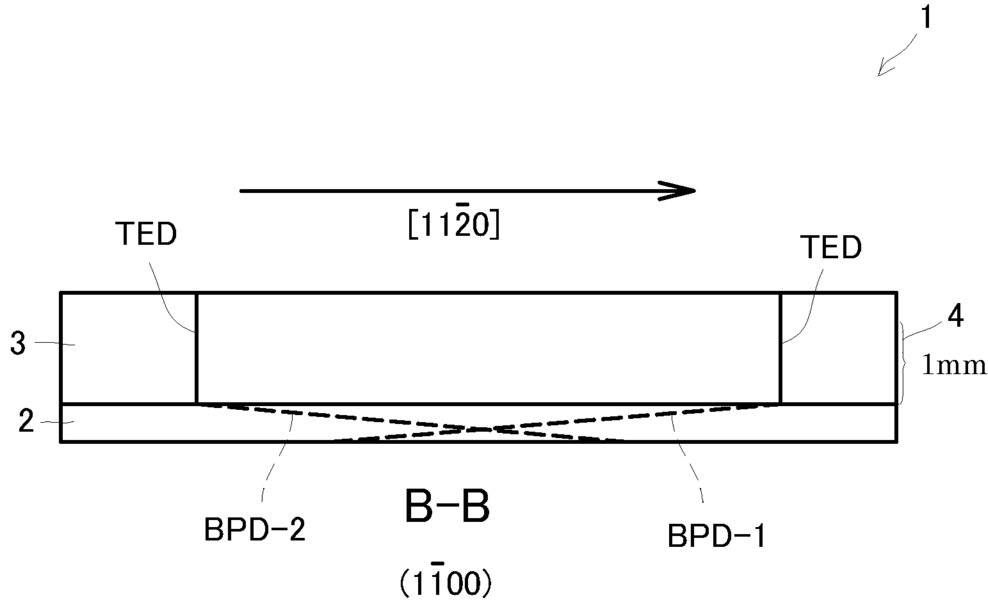
FIG. 3 is a sectional view taken on line B-B of FIG. 1.
Figure 4A:
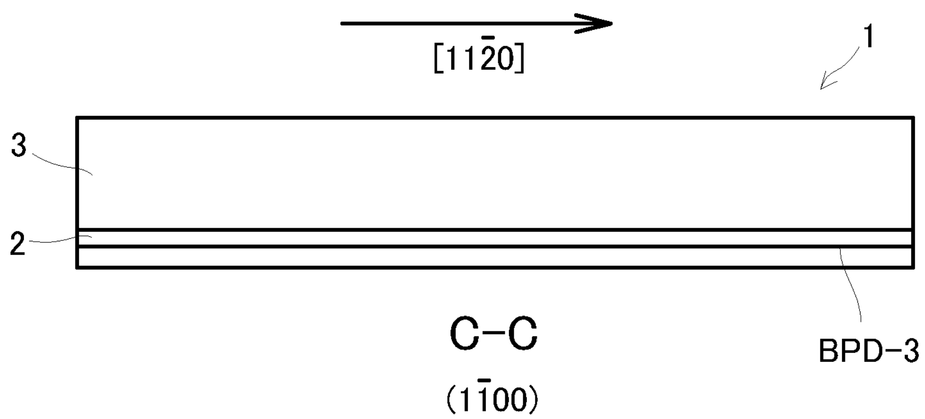
FIGS. 4A and 4B are sectional views taken on line C-C and line D-D, respectively, of FIG. 1.
Figure 4B:
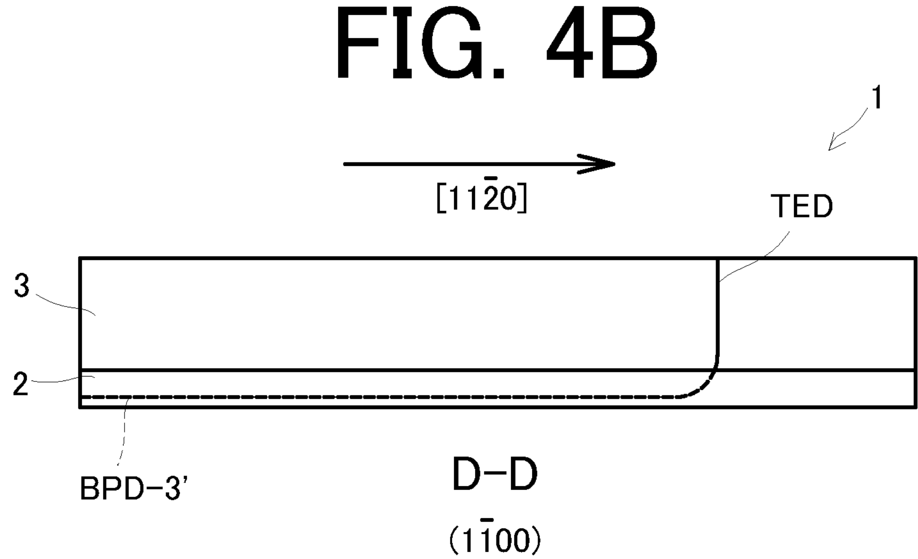

FIG. 1 is a plan view of the crystal surface of an SiC ingot 1 having an SiC single crystal layer 3 grown on a seed substrate 2 (see FIGS. 2A, 2B). FIGS. 2A and 2B are sectional views taken on line A-A of FIG. 1. FIG. 3 is a sectional view taken on line B-B of FIG. 1. FIGS. 4A and 4B are sectional views taken on line C-C and line D-D, respectively, of FIG. 1. The section on line A-A is a section of a (11-20) plane. The section on line B-B, the section on line C-C, and the section on line D-D are sections of a (1-100) plane. In FIGS. 1 to FIGS. 4A, 4B, some of BPDs, which do not appear in the surface or section, are indicated in broken lines. FIG. 2B indicates BPD-1 as projected onto the section on line A-A.

Using these drawings, an SiC ingot and a method for manufacturing it will be explained below. The SiC ingot 1 is obtained by growing the SiC single crystal layer 3 on one surface (will hereinafter be called a crystal growth surface) of the seed substrate 2 by the HTCVD method.

FIG. 2A shows a section in which a part of the SiC single crystal layer 3 at the initial stage of growth is enlarged. FIG. 2B represents the section in which the SiC single crystal layer 3 has grown to a considerable extent. As shown in FIG. 2A, the seed substrate 2 has an off-angle θ. The off-angle refers to an angle between one surface (crystal growth surface) of the seed substrate 2, where the crystal is grown, and a {0001} plane. The {0001} plane is a (0001) Si plane or a (000-1) C plane. The direction of the off-angle of the seed substrate 2 is [1-100]. Such seed substrate 2 having an off-angle in the [1-100] direction with respect to the {0001} plane can be obtained, for example, by cutting out an existing SiC ingot diagonally. The off-angle is, say, 1° or more, but 8° or less, although not restricted. The polytype of the seed substrate 2 is 4H.

The SiC single crystal layer 3 is formed on the crystal growth surface of the seed substrate 2. Such SiC single crystal layer 3 is prepared by the HTCVD method. Since a method for manufacturing the SC single crystal layer 3 by the HTCVD method is itself publicly known, a detailed explanation for it is omitted. However, the manufacture is performed, for example, under the following conditions:

In the HTCVD method, the growth temperature is preferably 2450° C. or higher. It is preferred that the average growth rate during a period until the SiC single crystal layer 3 is grown to a thickness of 1 mm be rendered 1 mm/h or more. The pressure inside a container accommodating the seed substrate 2 (will hereinafter be referred to as container-inside pressure) is set at 50 kPa or above, but 100 kPa or below. The ratio of the amount of an Si-based gas and the amount of a C-based gas supplied (i.e., C/Si ratio) is set at 1.0±0.2.

When the seed substrate 2 having an off-angle is subjected to epitaxial growth by the HTCVD method, growth in a lateral direction occurs, beginning at a step (level difference) present in the atomic plane. This lateral growth is called "step-flow growth", and the direction of this growth is called "step-flow direction". That is, the step-flow direction coincides with the [1-100] direction, the direction of the off-angle.

Figure 5:
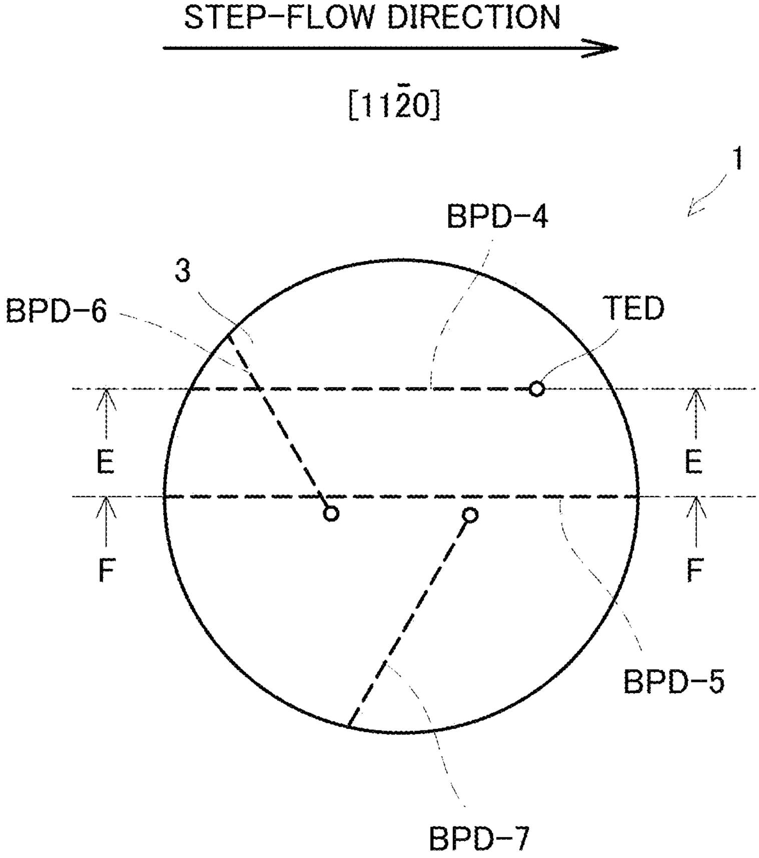
FIG. 5 is a plan view of a silicon carbide single crystal ingot according to the prior art.

FIG. 1 shows BPDs which are pure screw dislocations having dislocation lines heading in [11-20], [−2110] and [1-210] directions for the sake of simplicity, like FIG. 5 (except for a part of BPD-3'). BPD-3 is illustrated as a pure screw dislocation having a dislocation line heading in the [11-20] direction, BPD-1 is illustrated as a pure screw dislocation having a dislocation line heading in the [−2110] direction, and BPD-2 is illustrated as a pure screw dislocation having a dislocation line heading in the [1-210] direction.

By performing step-flow growth, BPD-1 and BPD-2 present in the seed substrate 2, which are BPDs having Burgers vectors nonparallel to the [1-100] direction, and BPD-3' whose Burgers vector curves midway in a direction nonparallel to the [1-100] direction, are converted to TEDs, as shown in FIG. 1, FIG. 2B, FIG. 3, and FIG. 4B. Assume that of the SiC single crystal layer 3, a portion at the initial stage of growth on the side of the seed substrate 2 is an initial-stage-of-growth portion 4. Then, the ratio of conversion from BPDs to TEDs in the initial-stage-of-growth portion 4 is 80% or higher.

As shown in FIG. 1, FIG. 2B, and FIG. 4A, step-flow growth is performed for the seed substrate 2 having an off-angle heading in the [1-100] direction. Thus, BPD-3 contained in the seed substrate 2 and having a dislocation line heading in the [11-20] direction parallels the boundary between the seed substrate 2 and the SiC single crystal layer 3 and, even if converted to TED, does not advance to the crystal growth surface. That is, because of the direction [1-100] of the off-angle of the seed substrate 2, as well as crystal growth performed with the direction [11-20] of the dislocation line being nonparallel, advancement of BPD-3 of the seed substrate 2 into the SiC single crystal layer 3 can be prevented.

Figure 6:
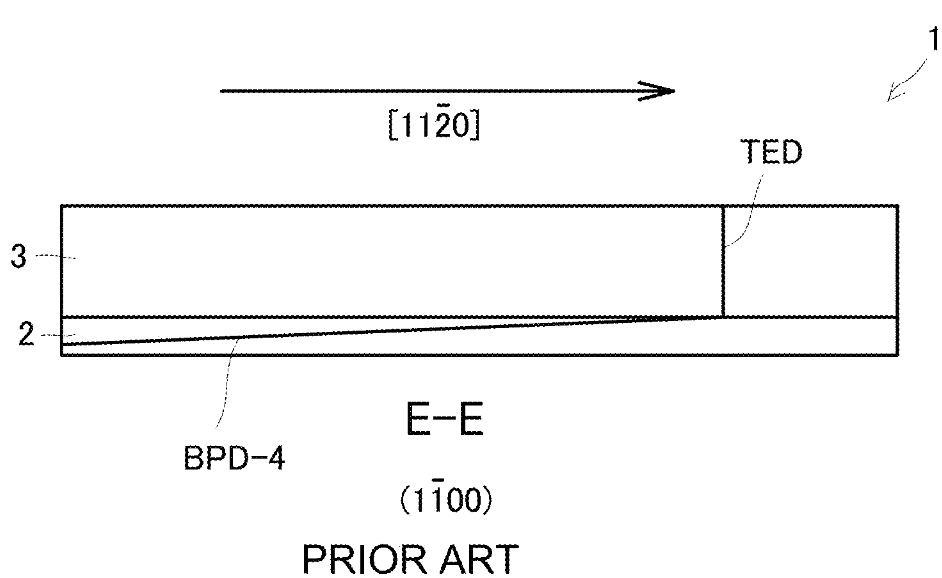
FIG. 6 is a sectional view taken on line E-E of FIG. 5.
Figure 7:
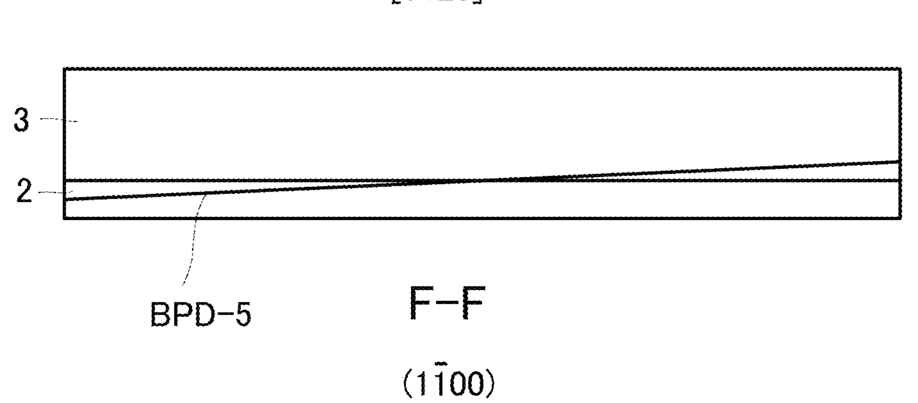
FIG. 7 is a sectional view taken on line F-F of FIG. 5.

According to the prior art shown in FIGS. 5 to 7, the step-flow direction is [11-20], and BPD-6 and BPD-7 having Burgers vectors nonparallel to the step-flow direction are all converted to TEDs. One of BPDs having Burgers vectors parallel to the step-flow direction (BPD-4, BPD-5), i.e. BPD-5, advances as such into the SiC single crystal layer 3 without being converted to TED. According to the present invention, by contrast, BPDs having Burgers vectors parallel to the step-flow direction [1-100] are eliminated, as shown in FIG. 1. By so doing, BPDs are either converted to TEDs as shown in FIG. 3 and FIG. 4B (BPD-1, BPD-2, BPD-3'), or relieved from advancement into the SiC single crystal layer 3 as shown in FIG. 4A (BPD-3). By so reducing BPDs advancing into the SiC single crystal layer 3, the ratio of conversion from BPDs to TEDs is increased in comparison with the prior art. Since BPD-3 having a Burgers vector in the [11-20] direction does not advance into the SiC single crystal layer 3 as noted above, the SiC single crystal layer 3 reduced in BPDs can be obtained.

The SiC ingot 1 prepared by the manufacturing method described as above has the SiC single crystal layer 3 formed on the seed substrate 2 composed of silicon carbide having an off-angle in the [1-100] direction with respect to the {0001} plane. In the SiC ingot 1, the ratio of conversion from BPDs to TEDs in the initial-stage-of-growth portion 4 is 80% or more. Since such SiC ingot 1 has BPDs reduced in the SiC single crystal layer 3 for use as a wafer, it is suitable for the manufacture of a semiconductor device.

It is also known that the SiC single crystal layer 3 prepared using the seed substrate 2 having an off-angle in the [1-100] direction minimally undergoes step bunching as compared with an SiC single crystal layer prepared using a seed substrate having an off-angle in the [11-20] direction. Since step bunching is reduced as seen here, the SiC ingot 1 of the present embodiment is suitable for the manufacture of a semiconductor device.

From the viewpoints of the type and performance enhancement of a semiconductor device to be produced, an SiC single crystal layer (wafer) prepared using a seed substrate having an off-angle in the [11-20] direction may be needed.

In such a case, the SiC single crystal layer 3 is formed using the seed substrate 2 having an off-angle in the [1-100] direction, whereafter a seed substrate having an off-angle in the [11-20] direction is prepared from the resulting SiC single crystal layer 3. Then, the new seed substrate is subjected to step-flow growth, whereby an SiC single crystal layer is further prepared.

The SiC single crystal layer (wafer) obtained in this manner is reduced in step bunching, so that irregularities of the surface are decreased. Consequently, the SiC ingot thus obtained is reduced in the irregularities of the surface, and also reduced in BPDs. Hence, it can provide a high quality wafer even more suitable for the manufacture of a semiconductor device.

According to the foregoing method for manufacturing the SiC ingot 1, moreover, the SiC ingot 1 from which a good quality wafer can be prepared as described above can be manufactured, and the SiC ingot 1 can be produced at a fast growth rate by the HTCVD method.

EXPLANATIONS OF LETTERS OR NUMERALS

1: Silicon carbide single crystal ingot (SiC ingot)
2: Seed substrate
3: Silicon carbide single crystal layer (SiC single crystal layer)
4: Initial-stage-of-growth portion

What is claimed is:

1. A silicon carbide single crystal ingot having a silicon carbide single crystal layer formed on a seed substrate, wherein the seed substrate is composed of silicon carbide having an off-angle in a [1-100] direction with respect to a {0001} plane, and a ratio of conversion from basal plane dislocations to threading edge dislocations in the silicon carbide single crystal layer is 80% or more within a range of a thickness of the silicon carbide single crystal layer from a boundary with the seed substrate.

* * * * *